United States Patent
Hamada

(10) Patent No.: US 9,645,487 B2
(45) Date of Patent: May 9, 2017

(54) METHOD FOR BONDING A PELLICLE, AND A BONDING APPARATUS USED IN THIS METHOD

(71) Applicant: SHIN-ETSU CHEMICAL CO., LTD., Tokyo (JP)

(72) Inventor: Yuichi Hamada, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 215 days.

(21) Appl. No.: 14/535,998

(22) Filed: Nov. 7, 2014

(65) Prior Publication Data

US 2015/0129103 A1    May 14, 2015

(30) Foreign Application Priority Data

Nov. 11, 2013 (JP) ................. 2013-232807

(51) Int. Cl.
| | |
|---|---|
| *G03F 1/62* | (2012.01) |
| *G03F 1/38* | (2012.01) |
| *G03F 1/64* | (2012.01) |
| *B32B 37/12* | (2006.01) |
| *B32B 37/18* | (2006.01) |
| *B32B 41/00* | (2006.01) |
| *G03F 7/20* | (2006.01) |
| *G03F 1/00* | (2012.01) |

(52) U.S. Cl.
CPC ............... *G03F 1/38* (2013.01); *B32B 37/12* (2013.01); *B32B 37/18* (2013.01); *B32B 41/00* (2013.01); *G03F 1/62* (2013.01); *G03F 1/64* (2013.01); *B32B 2559/00* (2013.01); *G03F 1/142* (2013.01); *G03F 7/70983* (2013.01); *Y10T 156/10* (2015.01)

(58) Field of Classification Search
CPC ......... Y10T 156/10; G03F 1/142; G03F 1/62; G03F 1/64; G03F 7/70983
See application file for complete search history.

(56) References Cited

U.S. PATENT DOCUMENTS 6,841,312 B1 * 1/2005 Kalk .................. G03F 1/64
                                                    355/75
2009/0029269 A1    1/2009 Shirasaki

FOREIGN PATENT DOCUMENTS

| JP | 63284551 A | * 11/1988 |
|---|---|---|
| JP | 64-13152 A | 1/1989 |
| JP | 2009-025560 A | 2/2009 |

(Continued)

OTHER PUBLICATIONS

Extended European Search Report dated Jun. 5, 2015, issued in counterpart European Patent Application No. 15151391.8 (7 pages).

(Continued)

*Primary Examiner* — Carson Gross
(74) *Attorney, Agent, or Firm* — Westerman, Hattori, Daniels & Adrian, LLP

(57) ABSTRACT

Here is proposed a method for bonding a pellicle to a stencil such as mask plate, which is characteristic in that the stencil-bonding agglutinant layer of the pellicle is warmed under load while the pellicle is being bonded to the stencil, preferably at a temperature in a range of 35 through 80 degrees C., and the load is increased stepwise and with intermittent removal of the load.

10 Claims, 1 Drawing Sheet

(56) References Cited

FOREIGN PATENT DOCUMENTS

JP          2011017833  A  *  1/2011

OTHER PUBLICATIONS

Extended European Search Report dated May 21, 2015, issued in counterpart European Patent Application No. 14192204.7 (8 pages).
Office Action dated Apr. 6, 2016, issued in counterpart Japanese Patent Application No. 2013-232807, with English ranslation. (5 pages).

* cited by examiner

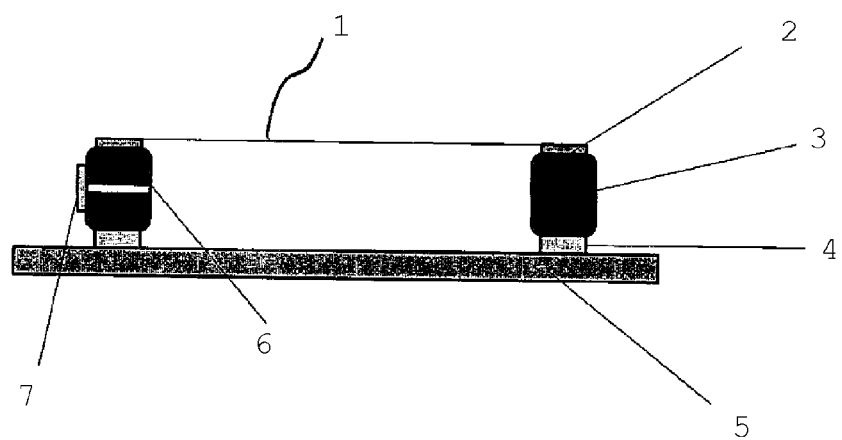

METHOD FOR BONDING A PELLICLE, AND A BONDING APPARATUS USED IN THIS METHOD

PRIORITY CLAIMED

The present non-provisional application claims priority, as per Paris Convention, from Japanese Patent Application No. 2013-232807 filed on 2013 Nov. 11, the disclosure of which is hereby incorporated by reference herein in its entirety.

FIELD OF THE TECHNOLOGY

The present invention relates to a method for bonding to an exposure stencil a pellicle for lithography, which is used to fend off dust from the stencil such as a mask for lithography, during a process of manufacturing a semiconductor device such as LSI and VLSI or a liquid crystal display panel, and also to an apparatus used in this bonding method.

BACKGROUND OF THE INVENTION

In the manufacture of a semiconductor device such as a large scale integrated circuit (LSI) and a very large scale integrated circuit (VLSI), or a liquid crystal display panel, a semiconductor wafer or a mother substrate for a liquid crystal display panel is irradiated with exposure light, whereby a pattern is transferred onto the surface of the wafer or the mother substrate; however, if a dust particle exists on the stencil, this particle can absorb or bend the light to thereby deform the pattern or blur the edges of the pattern transferred; furthermore the underlying surface is also blackened by soiling, whereby the size, quality, appearance and the like of the semiconductor wafer or the liquid crystal display panel mother substrate are degraded. In the present invention, an "exposure stencil" shall mean a mask for lithography or a reticle.

In order to prevent these problems, the operation of exposing the substrates is generally conducted in a clean room. However, even in a clean room environment, it is not always easy to keep the exposure stencil dust-free, and hence in order to fend off the dust from the surface of the exposure stencil, a pellicle which passes exposure light well is attached to cover the exposure stencil. In this manner, the dust is prevented from reaching the surface of the exposure stencil but can only alight on the pellicle membrane so that, if the exposure light is set to focus on the pattern of the exposure stencil, the dust on the pellicle membrane fails to shadow itself in the transferred pattern.

In general, a pellicle is manufactured by adhering a pellicle membrane to one annular face of a pellicle frame. The pellicle membrane is made of a nitrocellulose, cellulose acetate, a fluorine-containing polymer, or the like that has a high transmittance with respect to an exposure light (such as g-line, i-line, KrF excimer laser, ArF excimer laser, and $F_2$ excimer laser). The pellicle frame is made of an aluminum alloy such as A7075, A6061, and A5052, which are black almite-anodized in the surface, or of a stainless steel or of polyethylene, etc.

The adhesion of the pellicle membrane to an annular face of the pellicle frame is effected by laying a solvent capable of dissolving the pellicle membrane on the annular face and placing the membrane over the solvent and drying the latter by air flow, or by using an adhesive such as acrylic resin, epoxy resin and fluorine-containing resin. Furthermore, on the other one of the two annular faces of the frame is laid a stencil-bonding agglutinant layer made of a polybutene resin, a polyvinyl acetate resin, an acrylic resin, a silicone resin or the like for attaching the pellicle frame to the exposure stencil, and over this stencil-bonding agglutinant layer is laid a releasable liner for protecting the stencil-bonding agglutinant layer.

A pellicle is set in a manner such that the pellicle frame entirely surrounds the pattern region formed in the surface of the exposure stencil; as the pellicle is installed for the purpose of preventing the dust from adhering to the exposure stencil, the pattern region is isolated from the external atmosphere by means of the pellicle so that the dust outside the pellicle cannot reach the pattern region.

In recent years, the design rules for LSI have been modified in the direction of heightening the resolution density as high as sub-quarter micron order, and this goes hand-in-hand with shortening of the exposure light wavelength. In other words, the formerly prevalent g-line (436 nm) and i-line (365 nm) created by mercury lamps are being replaced by KrF excimer laser (248 nm), ArF excimer laser (193 nm), $F_2$ laser (157 nm) and the like. As the result of increasing exposure resolution, the flatness of the pattern-bearing face of the exposure stencil is very critically inspected after the pellicle is agglutinated to the exposure stencil, so that there is a need for minimizing the pellicle induced deformation of the mask which occurs as the pellicle is agglutinated to the mask.

In particular, the mask deformation caused upon agglutination of the pellicle to the mask is significantly affected by the flatness of the pellicle frame and the quality (softness) and the dimension of the stencil-bonding agglutinant layer. Accordingly there have been made efforts for suppressing the mask deformation, such as a pellicle in which the agglutinant layer is shaped to have a higher flatness, a pellicle where the flatness of the frame is controlled and a pellicle where a softer agglutinant is employed so as to minimize the mask deformation at the time of pellicle bonding.

For example, IP Publication 1 teaches about a pellicle whose agglutinant layer has a facial flatness of 15 micrometers or smaller. However, despite the efforts narrated above, it has been yet an unsolved problem to completely suppress the pellicle induced deformation of the mask.

PRIOR ART LITERATURE

IP Publications

[IP Publication 1] Japanese Patent Application Publication 2009-25560

SUMMARY OF THE INVENTION

Problems the Invention Seeks to Solve

In view of the above-mentioned circumstances, it is an object of the present invention to provide a method for bonding a pellicle to a mask plate contrived to reduce the deformation of the mask plate incurred at the time of bonding the pellicle to the mask plate; also it is an object to provide an apparatus for bonding the pellicle to the mask.

The present inventor researched hard in order to attain these objects, and came to a finding that it is possible to reduce the pellicle induced deformation of the mask plate if the agglutinant layer and the mask plate are warmed while the pellicle is being bonded to the mask plate so that the agglutinant is softened and the bonding between the agglutinant layer and the mask plate can be effected under a lower load pressure, hence the possession of the invention.

Means to Solve the Problems

Therefore, according to an aspect of the present invention a method is proposed for bonding a pellicle for lithography to a mask plate, the pellicle comprising a frame, a membrane bonded to one annular face of the frame via an adhesive and an agglutinant layer laid on an other annular face of the frame, the method comprising a loading step in which the agglutinant layer is warmed preferably by heating a stencil (mask plate) while the bonding is effected under a load, preferably of 100 N or lower. While any attempt to increase the temperature of the agglutinant layer above room temperature in this step constitutes a trespassing in the scope of the invention, the warming is preferably to a temperature of 35 through 80 degrees C.

A characteristic feature of the present invention is that the pellicle is bonded to the stencil under a load pressure of 100 N or lower, and it is preferable that an aimed load pressure is reached not within one minute.

Furthermore, it is another feature of the present invention that the load pressure is preferably increased step-wise to an aimed load pressure, through at least one step, and in this case it is more preferable that between the pressurizing steps the load is removed temporarily, preferably for 30 seconds or longer.

The bonding apparatus of the present invention is for practicing the method for bonding the pellicle to the mask plate, and is characteristic in comprising a heat source for warming the mask plate and the agglutinant layer of the pellicle, a loading means for pressing the pellicle to the mask plate, and a control means for controlling, during each duration of time between the pressurizing steps, the bonding load, the loading time, and the load removal time, as well as temperature of the heat source.

Effect of the Invention

According to the present invention, it is now possible to reduce the deformation of the mask plate which occurs as the pellicle is bonded to the mask plate, so that the problem of the pellicle induced deformation (PID) of the mask plate is curbed.

BRIEF DESCRIPTION OF THE DRAWINGS

FIG. 1 This is a schematic drawing showing a basic structure of a pellicle.

EMBODIMENTS OF PRACTICING THE INVENTION

Now, examples for practicing the present invention will be described, but the scope of the invention is not to be construed to be limited by them.

The method of the present invention relates to a pellicle comprising a frame, a membrane bonded to one annular face of the frame via an adhesive and an agglutinant layer laid on the other annular face of the frame, and is characteristic in that the agglutinant layer and the mask plate are warmed on the occasion of bonding the pellicle to the mask plate.

The basic structure of the pellicle 10 used in the present invention is as shown in FIG. 1. A pellicle membrane 1 is bonded to one annular face of a pellicle frame 3 of the pellicle 10 in a slack-free manner via an adhesive layer 2. An agglutinant layer 4 for bonding the pellicle 10 to a mask plate or a reticle 5 (an exposure stencil) is formed on the other annular face of the pellicle frame 3. Also, usually, over the exposed face of this stencil-bonding agglutinant layer 4 is laid a releasable liner (not shown) for protecting the agglutinant layer 4; a pressure control hole 6 (air vent) is made through a bar of the pellicle frame 3 and, when need be, a dust-stopping filter 7 is provided for prevention of contamination with particles.

The pellicle 10 of such construction of the present invention may be of various sizes, including, for example, pellicles for semiconductor lithography and a lithography for manufacturing a large-sized liquid crystal display panel, and the materials to make such pellicle 10 can be selected from conventionally used ones as those described above.

The kind of the pellicle membrane 1 to be used is not particularly specified, but amorphous fluorine-based polymers and the like which have conventionally been used for excimer laser are preferable. Examples of such amorphous fluorine-based polymer are CYTOP (a product name of ASAHI GLASS CO. LTD.), Teflon (registered trademark), and AF (a product name of Du Pont). If need be, it is permissible to dissolve such polymers in a solvent such as fluorine-based solvent to produce the pellicle membrane 1.

As for the material to make the pellicle frame 3, conventionally used aluminum alloys, such as JIS A7075, JIS A6061, and JIS A5052 are preferable, and in a case where an aluminum alloy is used, there is no specific requirement so long as the strength of the pellicle frame 3 is properly secured. It is preferable that the surface of the pellicle frame 3 is coarsen by sand blasting or chemical polishing before the surface is coated with a polymer layer, but the method of coarsening the surface of the pellicle frame 3 can be any other conventionally used method. Particularly in the case of an aluminum alloy frame, it is preferable that its surface is first blasted with beads of stainless, carborundum, glass or the like, followed by chemical polishing with NaOH or the like so as to coarsen the surface.

The material to make the agglutinant layer 4 can be selected from various adhesives, but acrylic adhesive and silicone adhesive are better. Also, the shape of the agglutinant layer is preferably such that its face to be bonded to the mask plate is flattened.

In the present invention, it is necessary to suppress the residual stress created at the time of bonding the pellicle to the mask plate so as to minimize the coercive effects of the pellicle frame upon the mask plate such as deforming effect, so that the pellicle 10 is preferably machined to have a highly flat face.

New, the method for bonding the pellicle according to the present invention will be explained with reference to an example. First, the pellicle 10 is set to a pellicle holder equipped on a stage of a pellicle bonding apparatus in a manner such that the agglutinant layer of the pellicle frame faces upward; then, the releasable liner for protecting the agglutinant layer is released therefrom; the mask plate is set in a manner such that its face to receive the pellicle faces downward; next, a start button is depressed so as to energize the heater of the pellicle boding apparatus where by the pellicle frame and the mask plate start being heated. When the temperatures of the pellicle frame and the mask plate are raised to a predetermined point, the mask plate is slowly descended onto the pellicle frame and the mask plate is let to press itself on the pellicle frame with its own weight.

In this pellicle bonding procedure, the temperatures of the pellicle frame and the mask plate greatly affect the bonding performance so that it is preferable that the temperatures are controlled to be between 35 and 80 degrees C. by monitoring them with a radiation thermometer or the like because thereby the stencil-bonding agglutinant layer is suitably softened such that it becomes possible to conduct a low load bonding which does not ill-affect the mask plate. Then, it is necessary that in actual bonding operation the temperatures of the pellicle frame and the mask plate be ascertained to be stably within the predetermined range. If the temperatures are lower than this predetermined range, the stencil-bonding agglutinant does not soften so much so that it becomes impossible to sufficiently lower the pellicle bonding load. On the other hand, if the temperatures are higher than this temperature range, the stencil-bonding agglutinant can degenerate or release outgas, hence not recommendable.

In the boding step of the present invention, the bonding load is preferably 100 N or lower, and the time for the load to reach the target value is preferably one minute or longer. When the bonding load is so great as to exceed 100 N, the mask plate can be over-stressed and the flatness of the mask face during the pellicle bonding operation may undergo deterioration, so the this if not recommendable. Also, if the target bonding load is reached in less than one minute, the mask plate may receive localized stress so that the uniformity of the mask flatness may be ill-affected, and hence not recommended. Hence in a concrete practice of the bonding step, the peripheral area of the back face of the mask plate is pressed by a press member provided in the upper part of the bonding apparatus, when one minute has passed since the landing of the pellicle on the mask plate. In this primary pressurizing step, as soon as a predetermined primary target load value is reached, which has taken one minute or longer, the load is maintained unchanged for 30 seconds, and then the load is completely removed for 30 seconds. Thereafter, in the secondary pressurizing step, the predetermined secondary target load value is reached by the working of the same press member, which again has taken one minute or longer, whereat the load is held unchanged for 30 seconds, and thus the pellicle bonding operation is completed. If need be, it is possible to conduct the pellicle bonding operation going through a further similar pressurizing step in addition to the primary and the secondary steps.

Also, in the bonding operation, it is preferable to conduct at least one pressure-holding step, whereat the load is held unchanged, before reaching the predetermined target load, rather than directly reaching the predetermined target load without a break, because in the former case it is possible to reduce the residual stress created in the mask plate by the pellicle adhesion. Furthermore, it is more preferable to conduct at least one pressure-removal step, whereat the load is cancelled between the pressure-holding step and the subsequent pressurizing step, for in this way more of the residual stress created in the mask plate by the pellicle adhesion is released. This stress releasing time is preferably 30 seconds or longer, for if it is shorter than 30 seconds, it is not possible to release the residual stress created in the mask plate sufficiently.

In the bonding method of the present invention, the reduction of the pellicle induced deformation of the mask plate is effected by lowering the load pressure as much as possible at the time of pellicle bonding operation so that if the flatness of the pellicle frame used and the flatness of the agglutinant face to which the mask plate is bonded and also the softness of the agglutinant layer are optimized, it is possible to render the method an excellent one for cancelling PID.

Next, the bonding apparatus of the present invention will be explained. This bonding apparatus is an apparatus for practicing the bonding method of the present invention so that it is equipped with a heating means for warming the agglutinant layer which bind the pellicle frame and the mask plate (exposure stencil) together. The apparatus is also equipped with a releasing device for peeling the releasable liner off the agglutinant layer by which it is protected, as well as with a lift means for raising and lowering the mask plate slowly to, for example, place the mask plate on the pellicle frame to thereby allow the mask plate to press itself to the pellicle frame by its own gravity; the apparatus is further equipped with a press means for pressing upon the peripheral part of the back face of the mask plate.

Also, this bonding apparatus is equipped with a control means which is capable of being programmed to control the load pressure, load time duration, load free time duration, etc. in any of the at least one pressuring cycle in order to help the proper bonding of the pellicle frame to the mask plated to be achieved.

EXAMPLES

Now, examples of the present invention will be explained in detail. Incidentally, in the following examples and comparative examples, the exposure stencil is embodied as a mask plate but the present invention can be equally applicable in cases wherein the exposure stencil is a reticle.

Example 1

In Example 1, a pellicle frame made of an aluminum alloy (external dimensions were 149 mm×115 mm×3.5 mm and width was 2 mm; the flatness of the annular face to which the agglutinant layer is laid was 15 micrometers) was prepared; this was cleaned with precision washing; a silicone agglutinant (X-40-3264, a product name of Shin-Etsu Chemical Co., Ltd.) was applied to the 15-micrometer-flat face; the frame was let to sit for 60 minutes at a room temperature. Thereafter, a flat separator was laid on a 5-micrometer-flat face of an aluminum plate, and the pellicle frame with the agglutinant layer was laid on this in a manner such that the agglutinant layer contacts the separator, whereby the surface of the agglutinant layer was made flat.

The pellicle frame and the aluminum plate were brought in an oven and heated at 60 degrees C. for 60 minutes whereby the agglutinant layer was hardened; then this pellicle frame together with the aluminum plate was brought out and the separator was peeled off. Next, the other annular face of the pellicle frame that was not coated with the agglutinant layer was coated with an adhesive CYTOP CTX-A, (a product name of ASAHI GLASS CO. LTD.), and this pellicle frame was heated at 130 degrees C., whereby the adhesive was hardened. Finally, the adhesive-bearing annular face of the pellicle frame was attached to a pellicle membrane, which had been temporarily put on a tool aluminum frame, which has a larger span than the pellicle frame, and that portion of the pellicle membrane that extends beyond the outer periphery of the pellicle frame was trimmed off, and thus a pellicle was completed.

Next, a "6025" mask plate, which is a square plate measuring 6.0 inch×6.0 inch×0.25 inch (thickness), was prepared and it was measured and found to have a flatness of 0.25 micrometer. After this measurement, this mask plate was set in the pellicle bonding apparatus, and was heated to 35 degrees C. by means of a heating device; then the pellicle, which had already been completed as described above, was set in the bonding apparatus, and was pressed against the mask plate in a manner such that the bonding load was increased for 60 seconds, at the end of which a predetermined load value of 100 N was reached; this bonding load was kept for 30 seconds and thus the pellicle was bonded to the mask plate, which was kept at 35 degrees C. throughout this bonding operation.

The flatness of the mask plate after being bonded to the pellicle was measured, and it was found to be 0.32 micrometer as opposed to the pre-bonding flatness of 0.25 micrometer—an increase by 0.07 micrometer, and this pellicle induced deformation was considered sufficiently small and hence the effect of the present invention was confirmed.

Table 1 shows the results of this Example 1 as well as Examples 2-4 and Comparative Examples 1-4, which will be explained herein below; in particular the flatness values of the mask plates before and after the bonding operation, the increments, and the pellicle bonding conditions are shown.

of 0.25 micrometer. This mask plate was set in the pellicle bonding apparatus, and was heated to 35 degrees C. by the heating device; then the pellicle was set in the bonding apparatus, and was pressed against the mask plate in a manner such that the bonding load was increased for 60 seconds, at the end of which a predetermined load value of 50 N was reached; this bonding load was kept for 30 seconds and then removed for 30 seconds, and then pressure was applied anew whereby the load increased for 60 seconds, at the end of which a predetermined value of 100 N was reached; this 100-N load was maintained for 30 seconds longer and the mask plate was maintained at 35 degrees C. throughout this bonding operation; thus the bonding was effected.

The flatness of the mask plate after being bonded to the pellicle was measured, and it was found to be 0.30 micrometer as opposed to the pre-bonding flatness of 0.25 micrometer—an increase by 0.05 micrometer, and this pellicle

TABLE 1

| | predetermined bonding loads | plate heating temperature | mask flatness (micrometer) | | | time required to reach predetermined final load |
|---|---|---|---|---|---|---|
| | | | before bonding | after bonding | increment | |
| Example 1 | 100N | 35 degrees C. | 0.25 | 0.32 | 0.07 | 60 sec |
| Example 2 | 100N | 80 degrees C. | 0.26 | 0.30 | 0.04 | 60 sec |
| Example 3 | 50N → 0N→ 100N | 35 degrees C. | 0.25 | 0.30 | 0.05 | 60 sec |
| Example 4 | 50N → 0N→ 100N | 80 degrees C. | 0.25 | 0.28 | 0.03 | 60 sec |
| Comparative Example 1 | 50N → 0N→ 100N | 25 degrees C. | 0.25 | 0.36 | 0.11 | 60 sec |
| Comparative Example 2 | 50N → 0N→ 100N | 100 degrees C. | 0.26 | 0.28 | 0.02 | 60 sec |
| Comparative Example 3 | 50N → 0N→ 100N | 80 degrees C. | 0.25 | 0.37 | 0.12 | 15 sec |
| Comparative Example 4 | 50N → 0N→ 150N | 80 degrees C. | 0.25 | 0.38 | 0.13 | 60 sec |

* In Comparative Example 2, a small amount of haze showed on the face of the mask plate in the vicinity of the agglutinant Example 2

In Example 2, a pellicle was produced in the same procedure as in Example 1. Then, a "6025" mask plate was prepared and it was measured and found to have a flatness of 0.26 micrometer. This mask plate was set in the pellicle bonding apparatus, and was heated to 80 degrees C. by the heating device; then the pellicle was set in the bonding apparatus, and was pressed against the mask plate in a manner such that the bonding load was increased for 60 seconds, at the end of which a predetermined load value of 100 N was reached; this bonding load was kept for 30 seconds and thus the pellicle was bonded to the mask plate, which was kept at 80 degrees C. throughout this bonding operation; thus the bonding was effected.

The flatness of the mask plate after being bonded to the pellicle was measured, and it was found to be 0.30 micrometer as opposed to the pre-bonding flatness of 0.26 micrometer—an increase by 0.04 micrometer, and this pellicle induced deformation was considered sufficiently small and hence the effect of the present invention was confirmed.

Example 3

In Example 3, a pellicle was produced in the same procedure as in Example 1. Again, a "6025" mask plate was prepared and it was measured and found to have a flatness induced deformation was considered sufficiently small and hence the effect of the present invention was confirmed.

Example 4

In Example 4, a pellicle was produced in the same procedure as in Example 1. Again, a "6025" mask plate was prepared and it was measured and found to have a flatness of 0.25 micrometer. This mask plate was set in the pellicle bonding apparatus, and was heated to 80 degrees C. by the heating device; then the pellicle was set in the bonding apparatus, and was pressed against the mask plate in a manner such that the bonding load was increased for 60 seconds, at the end of which a predetermined load value of 50 N was reached; this bonding load was kept for 30 seconds and then removed for 30 seconds, and then boding pressure was applied anew whereby the load increased for 60 seconds, at the end of which a predetermined value of 100 N was reached; this 100-N load was maintained for 30 seconds longer and the mask plate was maintained at 80 degrees C. throughout this bonding operation; thus the bonding was effected.

The flatness of the mask plate after being bonded to the pellicle was measured, and it was found to be 0.28 micrometer as opposed to the pre-bonding flatness of 0.25 micrometer—an increase by 0.03 micrometer, and this pellicle induced deformation was considered sufficiently small and hence the effect of the present invention was confirmed.

Comparative Example 1

In Comparative Example 1, a pellicle was produced in the same procedure as in Example 1. Then, a "6025" mask plate was prepared and it was measured and found to have a flatness of 0.25 micrometer. This mask plate was set in the pellicle bonding apparatus; it was not heated but kept at a room temperature of 25 degrees C. Then the pellicle was set in the bonding apparatus, and was pressed against the mask plate in a manner such that the bonding load was increased for 60 seconds, at the end of which a predetermined load value of 50 N was reached; this bonding load was kept for 30 seconds and then removed for 30 seconds, and then pressure was applied anew whereby the load increased for 60 seconds, at the end of which a predetermined value of 100 N was reached; this 100-N load was maintained for 30 seconds longer and the mask plate was maintained at 25 degrees C. throughout this bonding operation; thus the bonding was effected.

The flatness of the mask plate after being bonded to the pellicle was measured, and it was found to be 0.36 micrometer as opposed to the pre-bonding flatness of 0.25 micrometer—an increment by 0.11 micrometer, and this pellicle induced deformation was greater than an upper limit of an aimed range.

Comparative Example 2

In Comparative Example 2, a pellicle was produced in the same procedure as in Example 1. Again, a "6025" mask plate was prepared and it was measured and found to have a flatness of 0.26 micrometer. This mask plate was set in the pellicle bonding apparatus, and was heated by the heating device to 100 degrees C.; then the pellicle was set in the bonding apparatus, and was pressed against the mask plate in a manner such that the bonding load was increased for 60 seconds, at the end of which a predetermined load value of 50 N was reached; this bonding load was kept for 30 seconds and then removed for 30 seconds, and then pressure was applied anew whereby the load increased for 60 seconds, at the end of which a predetermined value of 100 N was reached; this 100-N load was maintained for 30 seconds longer and the mask plate was maintained at 100 degrees C. throughout this bonding operation; thus the bonding was effected.

The flatness of the mask plate after being bonded to the pellicle was measured, and it was found to be 0.28 micrometer as opposed to the pre-bonding flatness of 0.26 micrometer—an increment by 0.02 micrometer, and this pellicle induced deformation was considered sufficiently small; however, haze occurred on the face of the mask plate in the vicinity of the agglutinant layer and hence the effect of the present invention was not confirmed; the occurrence of the haze is thought to be a result of that the temperature at which the mask plate was maintained was too high.

Comparative Example 3

In Comparative Example 3, a pellicle was produced in the same procedure as in Example 1. Again, a "6025" mask plate was prepared and it was measured and found to have a flatness of 0.25 micrometer. This mask plate was set in the pellicle bonding apparatus, and was heated to 80 degrees C. by the heating device; then the pellicle was set in the bonding apparatus, and was pressed against the mask plate in a manner such that the bonding load was increased for 5 seconds, at the end of which a predetermined load value of 50 N was reached; this bonding load was kept for 30 seconds and then removed for 30 seconds, and then boding pressure was applied anew whereby the load increased for 15 seconds, at the end of which a predetermined value of 100 N was reached; this 100-N load was maintained for 30 seconds longer and the mask plate was maintained at 80 degrees C. throughout this bonding operation; thus the bonding was effected.

The flatness of the mask plate after being bonded to the pellicle was measured, and it was found to be 0.37 micrometer as opposed to the pre-bonding flatness of 0.25 micrometer—an increment by 0.12 micrometer, and this pellicle induced deformation was greater than the upper limit of the aimed range.

Comparative Example 4

In Comparative Example 4, a pellicle was produced in the same procedure as in Example 1. Again, a "6025" mask plate was prepared and it was measured and found to have a flatness of 0.25 micrometer. This mask plate was set in the pellicle bonding apparatus, and was heated to 80 degrees C. by the heating device; then the pellicle was set in the bonding apparatus, and was pressed against the mask plate in a manner such that the bonding load was increased for 60 seconds, at the end of which a predetermined load value of 50 N was reached; this bonding load was kept for 30 seconds and then removed for 30 seconds, and then boding pressure was applied anew whereby the load increased for 60 seconds, at the end of which a predetermined value of 150 N was reached; this 150-N load was maintained for 30 seconds longer, and the mask plate was maintained at 80 degrees C. throughout this bonding operation; thus the bonding was effected.

The flatness of the mask plate after being bonded to the pellicle was measured, and it was found to be 0.38 micrometer as opposed to the pre-bonding flatness of 0.25 micrometer—an increment by 0.13 micrometer, and this pellicle induced deformation was greater than the upper limit of the aimed range.

REPRESENTATION OF REFERENCE NUMERALS

1: pellicle membrane
2: adhesive layer for bonding pellicle membrane
3: pellicle frame
4: agglutinant layer for bonding mask
5: stencil such as mask and reticle
6: pressure control hole
7: dust-stopping filter
10: pellicle

The invention claimed is:
1. A method for bonding a pellicle for lithography to a stencil, comprising:
    providing said pellicle comprising a pellicle frame having first and second faces, a membrane bonded to the first face of the frame via an adhesive, and an agglutinant layer of an acrylic adhesive or silicone adhesive laid on the second face of the pellicle frame, the agglutinant layer being agglutinant at a room temperature;
    warming and softening said agglutinant layer, and bonding the pellicle with the stencil via the warmed and softened agglutinant layer under a bonding load pressure.

2. A method for bonding a pellicle for lithography to a stencil as claimed in claim 1, wherein said warming of the agglutinant layer is effected by heating the stencil to a temperature in a range of 35 through 80 degrees C.

3. A method for bonding a pellicle for lithography to a stencil as claimed in claim 1, wherein said bonding load pressure is 100 N or lower.

4. A method for bonding a pellicle for lithography to a stencil as claimed in claim 3, wherein said bonding load pressure of 100 N or lower is not to be reached in less than one minute.

5. A method for bonding a pellicle for lithography to a stencil as claimed in claim 3, wherein said bonding load pressure of 100 N or lower is to be reached stepwise.

6. A method for bonding a pellicle for lithography to a stencil as claimed in claim 5, wherein said bonding load pressure of 100 N or lower is to be reached stepwise in a manner such that when an intermediate load pressure lower than the load pressure is reached, the intermediate load pressure is kept for a period of time and then increased to the bonding load pressure.

7. A method for bonding a pellicle for lithography to a stencil as claimed in claim 5, wherein said bonding load pressure of 100 N or lower is to be reached stepwise in a manner such that when an intermediate load pressure is reached, the intermediate load pressure is kept for a first period of time and then load pressure is removed for a second period of time and then the load pressure is increased to the bonding load pressure.

8. A method for bonding a pellicle for lithography to a stencil as claimed in claim 7, wherein said second period of time is 30 seconds or longer.

9. A method for bonding a pellicle for lithography to a stencil as claimed in claim 2, wherein said bonding load pressure is 100 N or lower.

10. A method for bonding a pellicle for lithography to a stencil as claimed in claim 4, wherein said bonding load pressure of 100 N or lower is to be reached stepwise.

* * * * *